US012635590B2

(12) United States Patent
Hsieh et al.

(10) Patent No.: US 12,635,590 B2
(45) Date of Patent: May 19, 2026

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Ping-Yin Hsieh, Hsinchu (TW); Chih-Chien Pan, Taipei (TW); Li-Hui Cheng, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 715 days.

(21) Appl. No.: 17/693,446

(22) Filed: Mar. 14, 2022

(65) Prior Publication Data

US 2023/0290714 A1    Sep. 14, 2023

(51) Int. Cl.
| | |
|---|---|
| *H01L 23/498* | (2006.01) |
| *H01L 21/48* | (2006.01) |
| *H01L 25/16* | (2023.01) |
| *H10W 70/05* | (2026.01) |
| *H10W 90/00* | (2026.01) |
| *H10W 70/685* | (2026.01) |

(52) U.S. Cl.
CPC ......... *H10W 90/401* (2026.01); *H10W 70/05* (2026.01); *H10W 70/093* (2026.01); *H10W 90/00* (2026.01); *H10W 70/685* (2026.01)

(58) Field of Classification Search
CPC ..... H01L 23/49833; H01L 23/28–3192; H01L 23/49822; H01L 23/5383; H01L 23/5385; H01L 23/4985; H01L 23/5387; H01L 23/14; H01L 21/56–568; H01L 2924/181–186; H01L 2224/0231
See application file for complete search history.

(56) References Cited

U.S. PATENT DOCUMENTS

| | | | | |
|---|---|---|---|---|
| 2006/0292741 A1* | 12/2006 | Tseng | .................. | H01L 23/3128 |
| | | | | 257/E23.092 |
| 2013/0277829 A1* | 10/2013 | Yee | ........................ | H01L 21/565 |
| | | | | 257/737 |
| 2018/0108592 A1* | 4/2018 | Hembree | .............. | H01L 23/367 |
| 2018/0269188 A1* | 9/2018 | Yu | ........................... | H01L 23/14 |
| 2020/0075488 A1* | 3/2020 | Wu | ......................... | H01L 24/96 |
| 2020/0168568 A1* | 5/2020 | Kuo | ......................... | H01L 24/19 |
| 2020/0312774 A1* | 10/2020 | Yu | ....................... | H01L 21/6835 |

(Continued)

FOREIGN PATENT DOCUMENTS

| | | | | |
|---|---|---|---|---|
| TW | 202327015 A | * | 7/2023 | ......... H01L 21/3835 |

*Primary Examiner* — Jeff W Natalini
*Assistant Examiner* — Andrew John Zabel
(74) *Attorney, Agent, or Firm* — JCIPRNET

(57) ABSTRACT

A semiconductor device and a method of manufacturing the same are provided. The semiconductor device includes a first redistribution structure, a packaged device and a second redistribution structure. The packaged device is on a first side of the first redistribution structure and the second redistribution structure is on a second side of the first redistribution structure. An encapsulant is on the second side of the first redistribution structure and laterally around the second redistribution structure, wherein the encapsulant covers a periphery of the second redistribution structure such that an uncovered surface of the second redistribution structure is defined.

20 Claims, 18 Drawing Sheets

500

(56) References Cited

U.S. PATENT DOCUMENTS

| | | | |
|---|---|---|---|
| 2020/0395280 A1* | 12/2020 | Chen | H01L 24/83 |
| 2021/0305189 A1* | 9/2021 | Jin | H01L 25/0655 |
| 2022/0165648 A1* | 5/2022 | Kim | H01L 23/3128 |
| 2023/0066895 A1* | 3/2023 | Park | H01L 25/0652 |
| 2023/0178508 A1* | 6/2023 | Vincent | H01L 21/568 |
| | | | 438/107 |

* cited by examiner

SEMICONDUCTOR DEVICE AND MANUFACTURING METHOD THEREOF

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area.

As the demand for miniaturization, higher speed and greater bandwidth, as well as lower power consumption and latency has grown recently, there has grown a need for smaller and more creative packaging techniques of semiconductor dies and wafer level system integration (WLSI) have emerged. An example of such packaging systems is system on integrated substrate (SoIS) technology. In a SoIS device, a top semiconductor package is stacked on top of an integrated substrate using redistribution layers to allow external connectivity to a high level of integration and component density within the SoIS device. SoIS technology generally enables production of semiconductor devices with enhanced functionalities, small footprints, and component reliability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
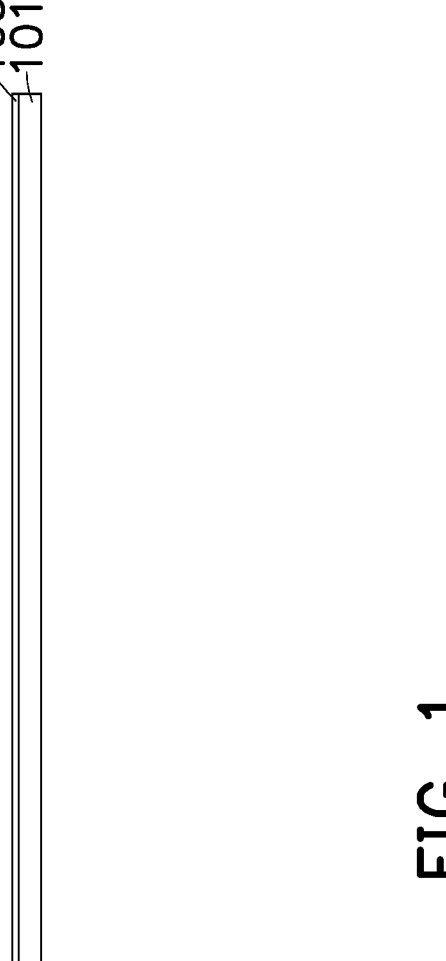
FIG. 1 through FIG. 16 are schematic cross-sectional views illustrating various stages in a manufacturing method of a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

The embodiment will now be described with respect to a specific embodiment using a system on integrated substrate (SoIS). A removable polymer buffer film is utilized in the SoIS to provide a flat surface, which is physically protected from being damaged or contaminated during processing. The clean and flat surface further provide increased process margin for subsequent processing thereon. However, the concepts presented in this article are not intended to be limited to the details set out below, and can be used in various applications. Each of these applications is fully intended to be included within the scope of the presented embodiments.

Referring to FIG. 1, this figure illustrates a cross-sectional view of a carrier substrate 101, in accordance with some embodiments. According to some embodiments, a carrier substrate 101 has a release film 103 coating a top surface of the carrier substrate 101. In some embodiments, the carrier substrate 101 is formed of a transparent material, and may be a glass carrier, a ceramic carrier, an organic carrier, or the like. The release film 103 may be formed of a polymer-based material, which may be removed along with the carrier substrate 101 from the overlying structures that will be formed in subsequent steps. In some embodiments, the release film 103 is an epoxy-based thermal-release material, which loses its adhesive property when heated, such as a light-to-heat-conversion (LTHC) release coating. In some other embodiments, the release film 103 may be an ultra-violet (UV) glue, which loses its adhesive property when exposed to UV lights. The release film 103 may be dispensed as a liquid and cured, may be a laminate film laminated onto the carrier substrate 101, or may be the like. The top surface of the release film 103 may be leveled and be substantially planar within process variations.

Figure 2:
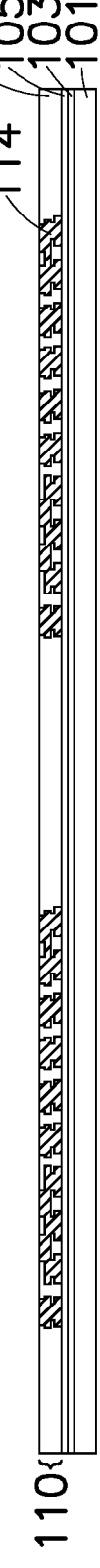

FIG. 2 illustrates the formation of a redistribution structure 110 over the carrier substrate 101, in accordance with some embodiments. According to some embodiments, a protective layer 105 is formed on the release film 103 prior to forming the redistribution structure 110. The protective layer 105 is deposited to provide physical protection of the features of subsequently formed layers once the carrier substrate is de-bonded, as described further below. Additionally, the protective layer 105 may provide electrical isolation and environmental protection. The protective layer 105 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like; or a combination thereof. The protective layer 105 may be formed, for example, by spin coating, lamination, chemical vapor deposition (CVD), or the like. The protective layer 105 may have an upper surface that is substantially level within process variations.

Still referring to FIG. 2, a redistribution structure 110 including a plurality of dielectric layers 112 and a plurality of metallization patterns 114 is formed on the protective layer 105. According to some embodiments, the redistribution structure 110 may be formed by initially forming a first layer of the metallization patterns 114 on the protective layer 105. In an embodiment, the metallization patterns 114 may be formed by initially forming a seed layer (not shown). In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using a suitable formation process such as physical vapor deposition (PVD), CVD, sputtering, or the like. A photoresist (also not shown) may then be formed to cover the seed layer and then be patterned to expose those portions of the seed layer that are located where the patterned conductive layer is desired to be formed. Once the photoresist has been formed and patterned, a conductive material may be formed on the seed layer. The conductive material may be a material such as copper, titanium, tungsten, aluminum, another metal, the like, or a combination thereof. The conductive material may be formed through a deposition process such as electroplating, electroless plating, or the like. However, while the material and methods discussed are suitable to form the conductive material, these are merely examples. Any other suitable materials or any other suitable processes of formation, such as CVD or PVD, may also be used to form a present one of the metallization patterns 114. Once the conductive material has been formed, the photoresist may be removed through a suitable removal process such as an ashing process or a chemical stripping process, such as using oxygen plasma or the like. Additionally, after the removal of the photoresist, those portions of the seed layer that were covered by the photoresist may be removed through, for example, a suitable wet etch process or dry etch process, which may use the conductive material as an etch mask. The remaining portions of the seed layer and conductive material form the present one of the metallization patterns 114.

Once the metallization patterns 114 have been formed, a first layer of the dielectric layers 112 is formed over the metallization patterns 114. According to some embodiments, the dielectric layers 112 are made of one or more suitable dielectric materials such as an oxide (e.g., silicon oxide), a nitride (e.g., silicon nitride), a polymer material, a polyimide material, a low-k dielectric material, a molding material (e.g., an EMC or the like), another dielectric material, the like, or a combination thereof. The dielectric layers 112 may be formed by a process such as spin-coating, lamination, CVD, the like, or a combination thereof. However, any suitable dielectric materials and any suitable processes may be used. Furthermore, some or all of the dielectric layers 112 may comprise the same dielectric materials and/or some of the dielectric layers 112 may comprise different dielectric materials from the other layers.

Once a layer of the dielectric layers 112 has been formed, openings may be formed through that layer using a suitable photolithographic mask and etching process. For example, a photoresist may be formed and patterned over the insulating layer and one or more etching processes (e.g., a wet etching process or a dry etching process) are utilized to remove portions of the insulating layer. In some embodiments, the dielectric layers 112 are formed of a photosensitive polymer such as PBO, polyimide, BCB, or the like, in which openings may be patterned directly using a photolithographic mask and etching process. The openings formed in the first layer of the dielectric layers 112 may expose one or more of underlying conductive layers in preparation for the deposition of an overlying one of the metallization patterns 114 through the openings to form vias and overlying conductive lines.

Any suitable number of the dielectric layers 112 and any suitable number of the metallization patterns 114 may then be formed one over the other to provide additional routing along with electrical connections within the redistribution structure 110. The redistribution structure 110 is shown as an example having respective three layers of dielectric layers 112 and metallization patterns 114. More or fewer dielectric layers and metallization patterns may be used in the redistribution structure 110.

Figure 3:
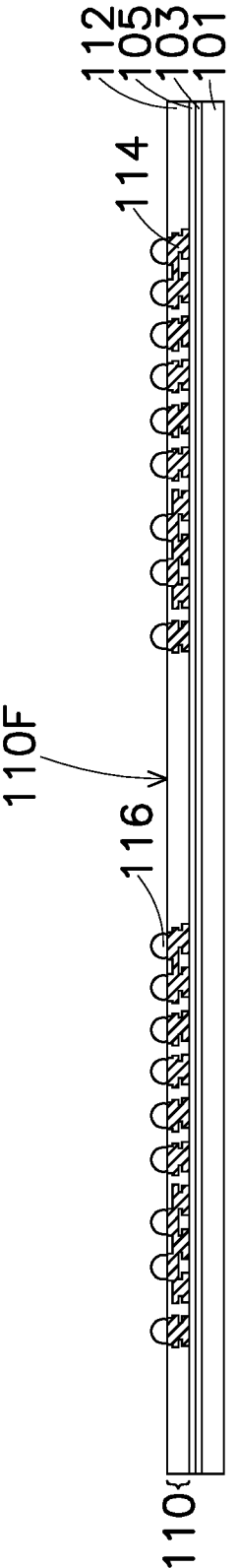

Turning to FIG. 3, a plurality of first conductive connectors 116 is formed over the redistribution structure 110, in accordance with some embodiments. The first conductive connectors 116 may be formed at a front-side surface 110F of the redistribution structure 110. For example, the first conductive connectors 116 may be formed on exposed portions of the topmost metallization patterns 114 of the redistribution structure 110. In some embodiments, underbump metallizations (UBMs) are formed on the redistribution structure 110, and the first conductive connectors 116 are formed over the UBMs. The first conductive connectors 116 may be, for example, contact bumps or solder balls, although any suitable types of connectors may be utilized. In an embodiment in which the first conductive connectors 116 are contact bumps, the first conductive connectors 116 may include a material such as tin, or other suitable materials, such as silver, lead-free tin, or copper. In an embodiment in which the first conductive connectors 116 are solder bumps, the first conductive connectors 116 may be formed by initially forming a layer of solder using such a technique such as evaporation, electroplating, printing, solder transfer, ball placement. Once a layer of solder has been formed on the structure, a reflow may be performed in order to shape the material into the desired bump shape for the first conductive connectors 116.

Figure 4:
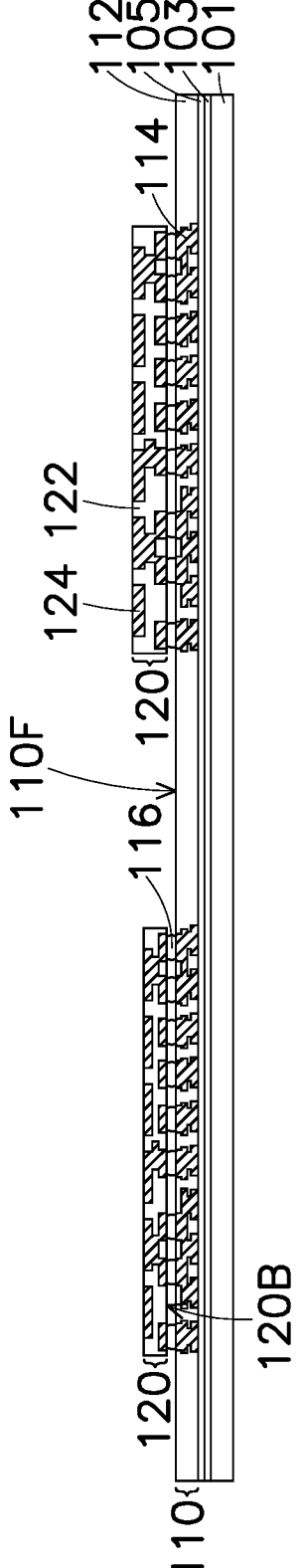

In FIG. 4, a plurality of substrates 120 is bonded with the redistribution structure 110, in accordance with some embodiments. According to some embodiments, the substrates 120 are pre-made or pre-formed substrates. In some embodiments, the substrates 120 are printed circuit boards (PCB) or the like. In some other embodiments, the substrates 120 are interposers. In the illustrated embodiment, each substrate 120 includes an interconnect structure including a plurality of dielectric layers 122 and a plurality of metallization patterns 124 embedded in the dielectric layers 122, and the metallization patterns 124 are interconnected with one another. That is, the metallization patterns 124 are electrically connected to one another. In an embodiment in which the substrates include interconnected metallization patterns, the substrates may be referred as redistribution substrates. In a particular embodiment, the substrates 120 may have a thickness range from 1000 μm to 1500 μm.

As illustrated in FIG. 4, the substrates 120 are bonded to the front-side surface 110F of the redistribution structure 110. In some embodiments, the substrates 120 are attached to the redistribution structure 110 through the first conductive connectors 116. For example, the metallization patterns 124 exposed at back-side surface 120B of each substrate 120 are in physical contact with the first conductive connectors 116 to render electrical connection between each substrate 120 and the redistribution structure 110. In some embodiments, after the metallization patterns 124 of each substrate 120 are attached to the first conductive connectors 116, a reflow process may be performed to reshape the first conductive connectors 116.

Referring again to FIG. 4, an exemplary embodiment of two substrates 120 bonded to the redistribution structure 110 is shown. In the exemplary embodiment, the adjacent substrates 120 may respectively include different numbers of layers of dielectric layers 122 and metallization patterns 124. That is, each substrate 120 may have different thicknesses. For example, a range of variation of thickness difference between the adjacent substrates 120 may between plus or minus ten percent of its value. In a particular embodiment, the substrates 120 may have a thickness difference range from 100 µm to 150 µm. In an alternative embodiment, each substrate 120 may include the same number of layers of dielectric layers 122 and metallization patterns 124, thus thicknesses of the adjacent substrates 120 may be substantially the same.

Figure 5:
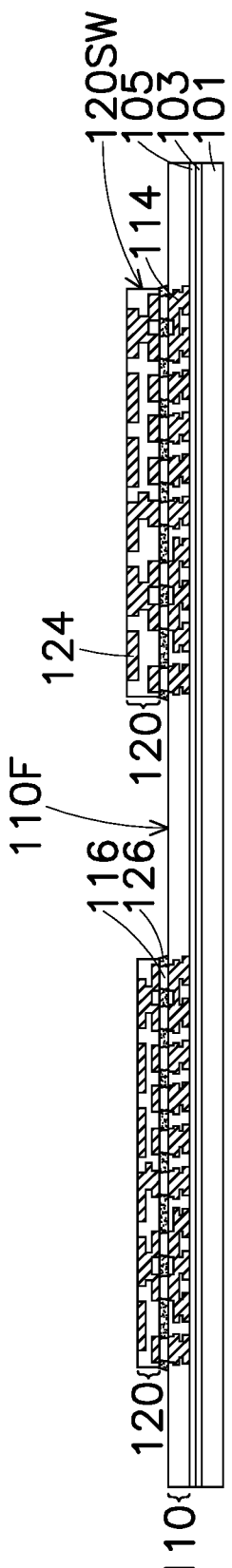

Referring to FIG. 5, an underfill layer 126 is formed between each substrate 120 and the front-side surface 110F of the redistribution structure 110. For example, the underfill layer 126 wraps around the bottommost metallization patterns 124 and the first conductive connectors 116. In some embodiments, the underfill layer 126 is utilized to protect these elements. In some embodiments, the underfill layer 126 further covers portions of each sidewall 120SW of each substrate 120. In some embodiments, a material of the underfill layer 126 is an insulating material and includes a resin (e.g., epoxy resin), a filler material, a stress release agent (SRA), an adhesion promoter, other material, or a combination thereof. In alternative embodiments, the underfill layer 126 is optional and may be omitted.

Figure 6:
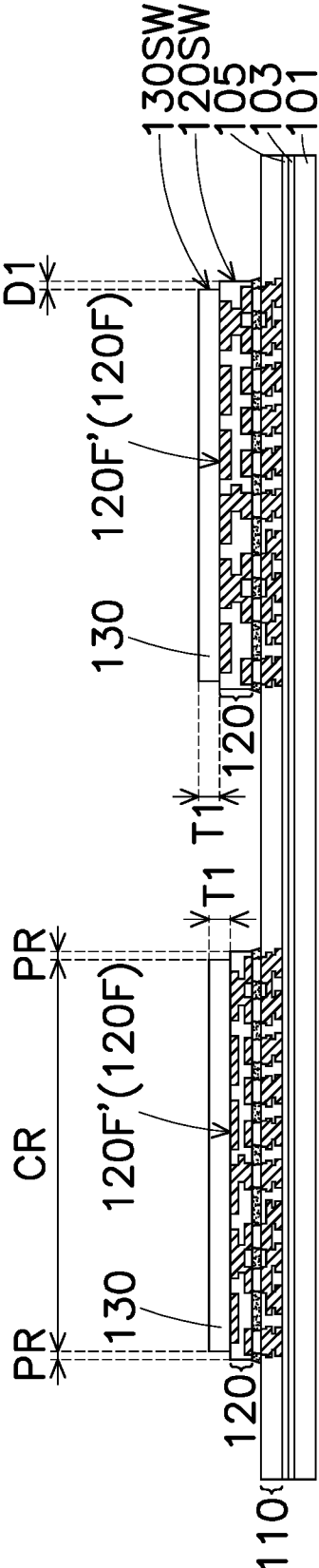

FIG. 6 illustrates the formation of a plurality of buffer films 130 on the substrates 120, in accordance with some embodiments. According to some embodiments, the buffer films 130 are directly formed on front-side surfaces 120F of the substrates 120. In some embodiments, the buffer films 130 are protective films providing physical protection of the underlying substrates 120 during subsequent processes. Further, the buffer films 130 are temporary films and will be removed later. In some embodiments, the buffer films 130 comprise removable or dissolvable polymer material. For example, a material of the buffer films 130 may include, but is not limited to, acrylic resin, epoxy, polyimide (PI), PBO or the like. In accordance with some embodiments, the buffer films 130 may be subsequently removed by using an aqueous alkaline solution such as KOH-based or NaOH-based solution.

In some embodiments, the buffer films 130 are formed by selectively dispensing a removable material such as acrylic resin or epoxy over the front-side surfaces 120F of the substrates 120 and irradiating the removable material simultaneously. In some embodiments, the removable material is dispensed on the substrates 120 by printing such as inkjet printing, screen printing, or the like. In alternative embodiments, the removable material may be dipped or dispensed depending on the application and process. In some embodiments, the removable material is irradiated by UV beams while dispensing to reduce the fluidity of the removable material. In some embodiments, the buffer films 130 may be formed by repeating the removable material dispensing and irradiation several cycles to obtain a desired thickness. For example, thicknesses T1 of the buffer films 130 may range from 50 µm to 200 µm.

Referring again to FIG. 6, each buffer films 130 is formed so as to cover a respective major surface 120F' of each substrate 120, in accordance with some embodiments. According to some embodiments, the major surface 120F' of each substrate 120 refers to the central region CR (see FIG. 17) of the front-side surface 120F of each substrate 120. That is, a perimeter region PR (see FIG. 17) of the front-side surface 120F of each substrate 120 remains uncovered after the formation of the buffer films 130. By leaving the perimeter region PR of each substrate 120 uncovered by the respective buffer film 130, sidewalls 120SW of each substrate 120 may be free from the covering of the respective buffer film 130, and thus each substrate 120 can be well-sealed by the molding compound material subsequently formed. As shown in cross-sectional view of the exemplary structure of FIG. 6, sidewalls 130SW of each buffer film 130 are located on each substrate 120. That is, a span of each substrate 120 is greater than a span of each buffer film 130. For example, the sidewalls 130SW of each buffer film are laterally offset inwards from the respective sidewalls 120SW by a distance D1. In a particular embodiment, the distance D1 may be greater than 0 µm and less than 3000 µm. Alternatively, the sidewalls 130SW may include, but are not limited to, substantially straight profiles.

Figure 7:
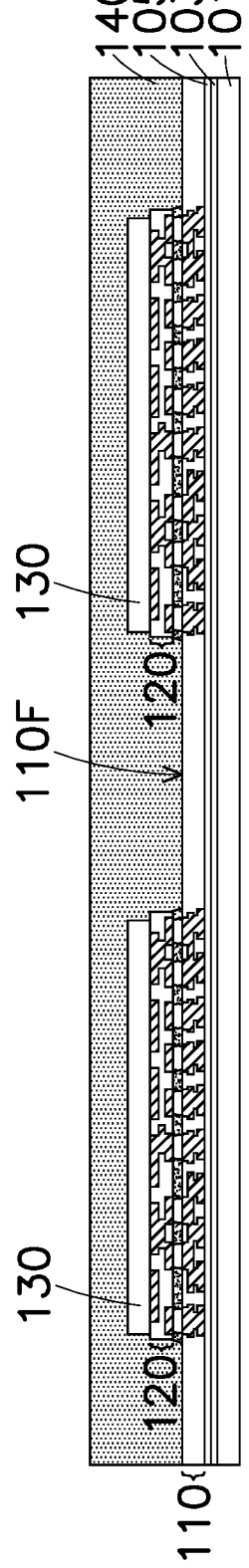

Referring to FIG. 7, the substrates 120 and the buffer films 130 are molded and encapsulated in an insulating encapsulant 140, in accordance with some embodiments. The insulating encapsulant 140 may be formed over the redistribution structure 110 to cover and laterally surround the substrates 120 and the buffer films 130. In some embodiments, the insulating encapsulant 140 is formed on the front-side surface 110F of the redistribution structure 110. In some embodiments, the insulating encapsulant 140 is formed through, for example, a compression molding process or transfer molding. In one embodiment, a curing process is performed to cure the insulating encapsulant 140.

In some embodiments, a material of the insulating encapsulant 140 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating encapsulant 140 may include an acceptable insulating encapsulation material. In some embodiments, the insulating encapsulant 140 may further include inorganic filler or inorganic compound (e.g. silica, clay, and so on) which can be added therein to optimize coefficient of thermal expansion (CTE) of the insulating encapsulant 140. The disclosure is not limited thereto.

Figure 8:
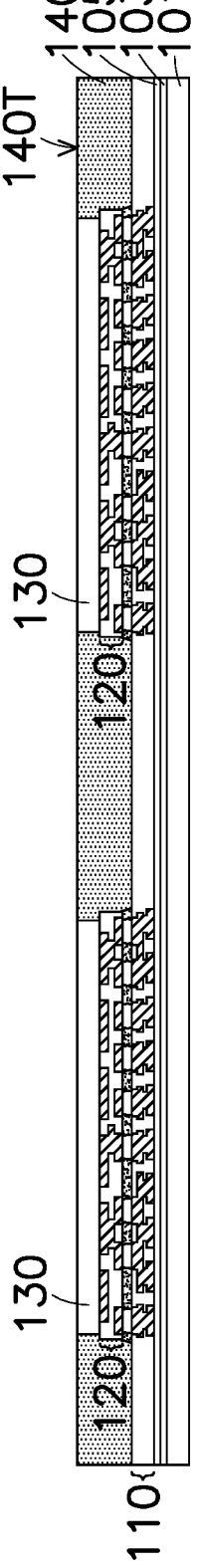

FIG. 8 further illustrates a planarization process that is performed on the insulating encapsulant 140, in accordance with some embodiments. The planarization process may be performed, e.g., using a mechanical grinding process, a chemical mechanical polishing (CMP) process, a series of etches, and other removal processes, or the like. The planarization process removes excess portions of the insulating encapsulant 140 and exposes top surfaces of the buffer films 130. In some embodiments, the planarization process may comprise a thinning technique (e.g., a grinding process) used to thin the insulating encapsulant 140 and reduce thicknesses of the buffer films 130. After the planarization process, the buffer films 130 may have surfaces level with a top surface 140T of the insulating encapsulant 140.

Figure 9:
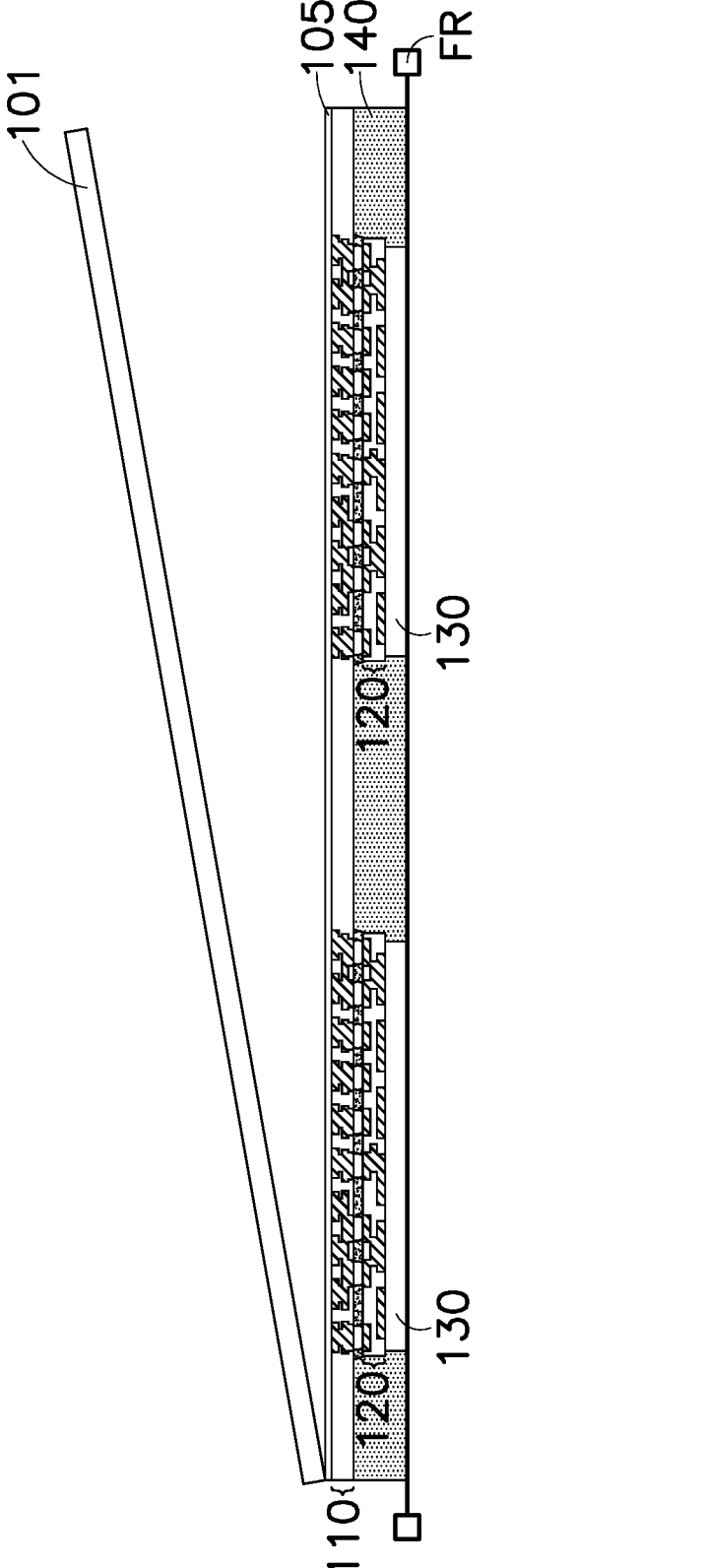

Turning to FIG. 9, the structure shown in FIG. 8 is flipped over and attached to a frame FR, and carrier substrate de-bonding is performed to detach (de-bond) the carrier substrate 101 from the protect layer 105. In accordance with some embodiments, the de-bonding includes projecting a light such as a laser light or an UV light on the release film 103 so that the release film 103 decomposes under the heat of the light and the carrier substrate 101 can be removed. Once the de-bonding is performed, a surface of the protective layer 105 is exposed.

Figure 10:
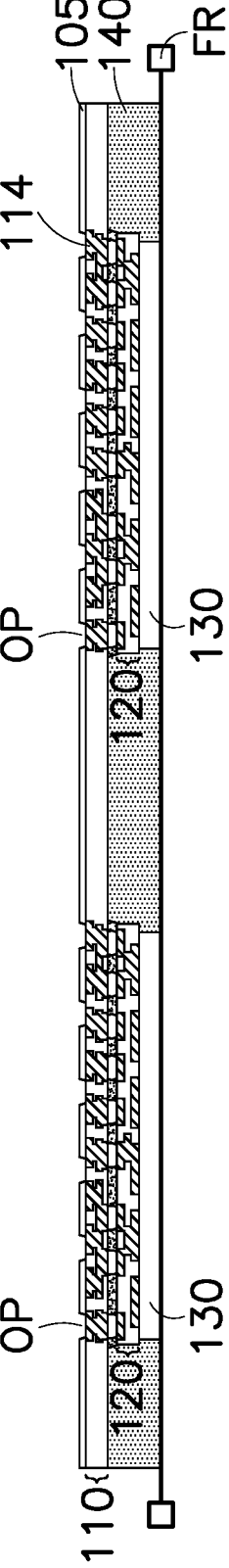

Referring to FIG. 10, a plurality of openings OP is formed in the protective layer 105 above the redistribution structure 110, exposing the metallization patterns 114 of the redistribution structure 110. The openings OP may be formed by etching, a drilling process such as laser drilling, mechanical drilling, or the like. The openings OP may have a rectangular, circular, or other shape in a top-down view. According to some embodiments, the openings OP are formed at particular locations such as regions right above the substrates 120.

Figure 11:
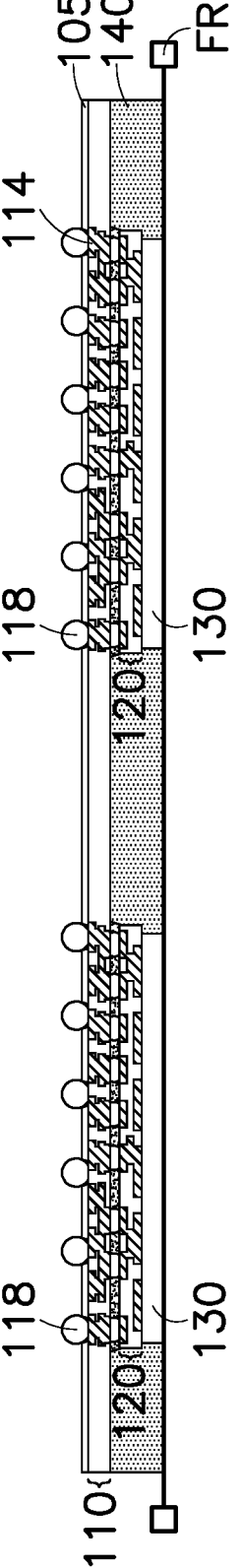

FIG. 11 illustrates a plurality of second conductive connectors 118 formed in the openings OP, in accordance with some embodiments. The second conductive connectors 118 may be used to bond the redistribution structure 110 to an integrated circuit package (see FIG. 13) and may be first formed on the redistribution structure 110, and then reflowed to complete the bond. For example, as shown in FIG. 11, the second conductive connectors 118 are first formed in the openings OP coupled to the exposed metallization patterns 114. In some embodiments, the second conductive connectors 118 may be similar to the first conductive connectors 116 described above in FIG. 3.

Figure 12:
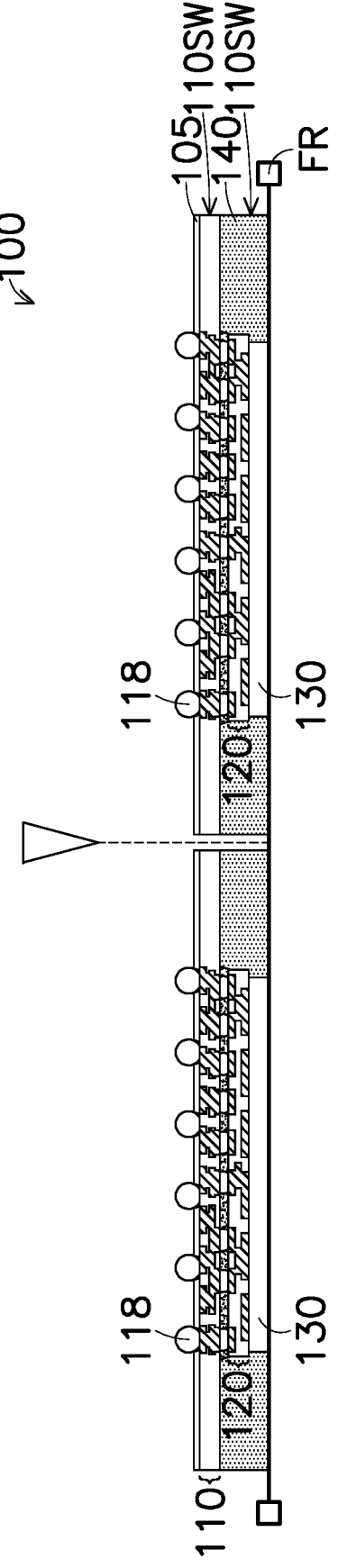

FIG. 12 illustrates a singulation process of the structure illustrated in FIG. 11, in accordance with some embodiments. In some embodiments, the singulation process typically involves dicing with a rotation blade and/or a laser beam. In other words, the singulation process includes a laser cutting process, a mechanical cutting process, a laser grooving process, other suitable processes, or a combination thereof. For example, a laser grooving process may be performed on the structure illustrated in FIG. 11 to form trenches (not shown) in the said structure. Thereafter, a mechanical cutting process may be performed on the locations of the trenches to cut through the said structure, so as to obtain a package component 100. The package component 100 may include one of the substrates 120 and one of the buffer films 130 collectively over the front-side surface 110F of the redistribution structure 110 and encapsulated in the insulating encapsulant 140. In the illustrated embodiment, sidewalls 110SW of the redistribution structure 110 may be substantially aligned with outer sidewalls 140SW of the insulating encapsulant 140.

Figure 13:
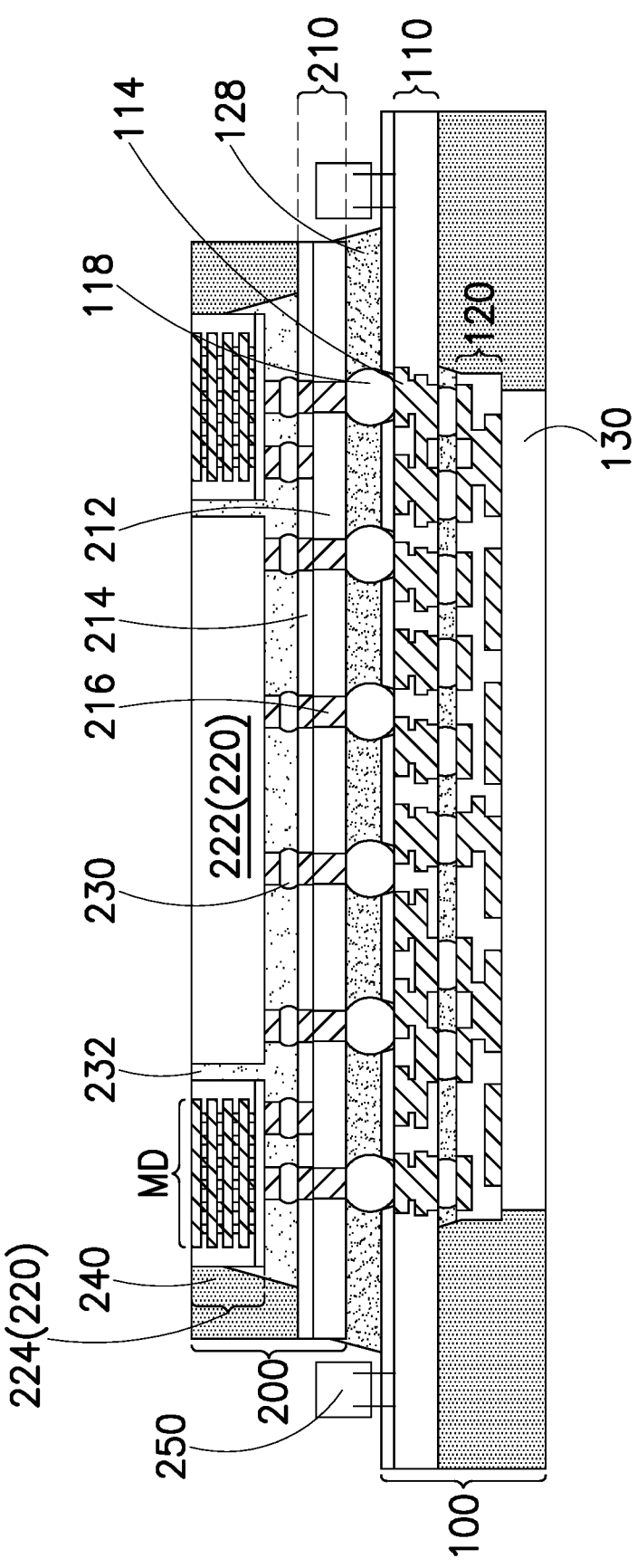

Referring to FIG. 13, an integrated circuit package 200 may be attached to the to the package component 100 through the second conductive connectors 118. The second conductive connectors 118 attach the integrated circuit package 200 to the metallization patterns 114 of the redistribution structure 110 such that an electrical connection between the integrated circuit package 200 and the package component 100 is established. For example, the integrated circuit package 200 may be electrically connected to the substrate 120 of the package component 100 through the redistribution structure 110. According to some embodiments, attaching the integrated circuit package 200 may include placing the integrated circuit package 200 on the second conductive connectors 118 and reflowing the second conductive connectors 118 to physically and electrically couple the integrated circuit package 200 and the redistribution structure 110. In some embodiments, an underfill layer 128 is then formed surrounding the second conductive connectors 118 and the integrated circuit package 200. The underfill layer 128 may reduce stress and protect the joints resulting from the reflowing of the second conductive connectors 118. The underfill layer 128 may be formed by a capillary flow process after the integrated circuit package 200 is attached, or may be formed by a suitable deposition method.

The integrated circuit package 200 may include device dies therein, and may include other package components such as interposers, packages, die stacks, or the like. In accordance with some embodiments, the integrated circuit package 200 includes package components 210, 222, and 224. In accordance with some embodiments, the package component 210 is interposer, which includes substrate 212 and the corresponding dielectric layer 214. Accordingly, the package component 210 may also be referred to as interposer 210, while the package component 210 may also be of other types. The structure of the interposer 210 is illustrated schematically, and the details such as the plurality of dielectric layers on the top side and bottom side of the substrate 212, metal lines and vias, metal pads, or the like, are not shown. Through-substrate vias 216 (sometimes referred to as through-silicon vias 216 when the substrate 212 is a silicon substrate) penetrate through the substrate 212. The through-substrate vias 216 are used to interconnect the conductive features on the top side and the bottom side of the substrate 212 to each other.

In accordance with some embodiments, the package components 222 and 224 are bonded to the respective underlying package component 210. FIG. 13 illustrates a cross-section wherein one package component 222 and two package components 224 are visible, and are bonded to the same package component 210. These are, of course, merely examples and are not intended to be limiting. In some embodiments, the package components 222 and 224 are different types of package components, and are collectively referred to as package components 220.

Each of the package components 220 may be a device die, a package with a device die(s) packaged therein, a system-on-chip (SoC) die including a plurality of integrated circuits (or device dies) integrated as a system, or the like. The device dies in the package components 220 may be or may comprise logic dies, memory dies, input-output dies, integrated passive devices (IPDs), or the like, or combinations thereof. For example, the logic device dies in the package components 220 may be central processing unit (CPU) dies, graphic processing unit (GPU) dies, mobile application dies, micro control unit (MCU) dies, baseband (BB) dies, Application processor (AP) dies, or the like. The memory dies in the package components 220 may include static random access memory (SRAM) dies, dynamic random access memory (DRAM) dies, or the like. The device dies in the package components 220 may include semiconductor substrates and interconnect structures.

In a particular embodiment described herein, the package components 222 are referred to as device dies, which may be SoC dies in accordance with some embodiments; the package components 224 may be memory stacks such as high-performance memory (HBM) stacks. The package components 224 may include memory dies MD forming a die stack, and an encapsulant (such as a molding compound) encapsulating the memory dies MD therein. When viewed from top, the encapsulant may form a ring encircling memory dies MD, and may also extend into the gaps between memory dies MD.

Still referring to FIG. 13, the package components 220 may be bonded to the underlying package component 210, for example, through solder regions 230. An underfill layer 232 is formed between the package components 220 and the underlying package component 210. In accordance with some embodiments, the integrated circuit package 200 is formed through a chip-on-wafer (CoW) bonding process, wherein the package components 220, which are discrete chips/packages, are bonded to the package components 210 that are in an unsawed wafer to form a reconstructed wafer. After the formation of the underfill layer 232, an encapsulant such as molding compound 240 may be applied, followed by a planarization process on the molding compound 240 to level its top surface with the top surfaces of package components 220. A reconstructed wafer is thus formed. The reconstructed wafer is sawed apart to form discrete integrated circuit package 200, which is subsequently bonded to the package component 100.

Other package components such as independent passive devices (IPDs) 250 may be also bonded to the package component 100. In accordance with some embodiments, the IPDs 250 may be discrete capacitors, discrete inductors, discrete resistors, or the like, and no active devices such as transistors are formed in IPDs 250.

Figure 14:
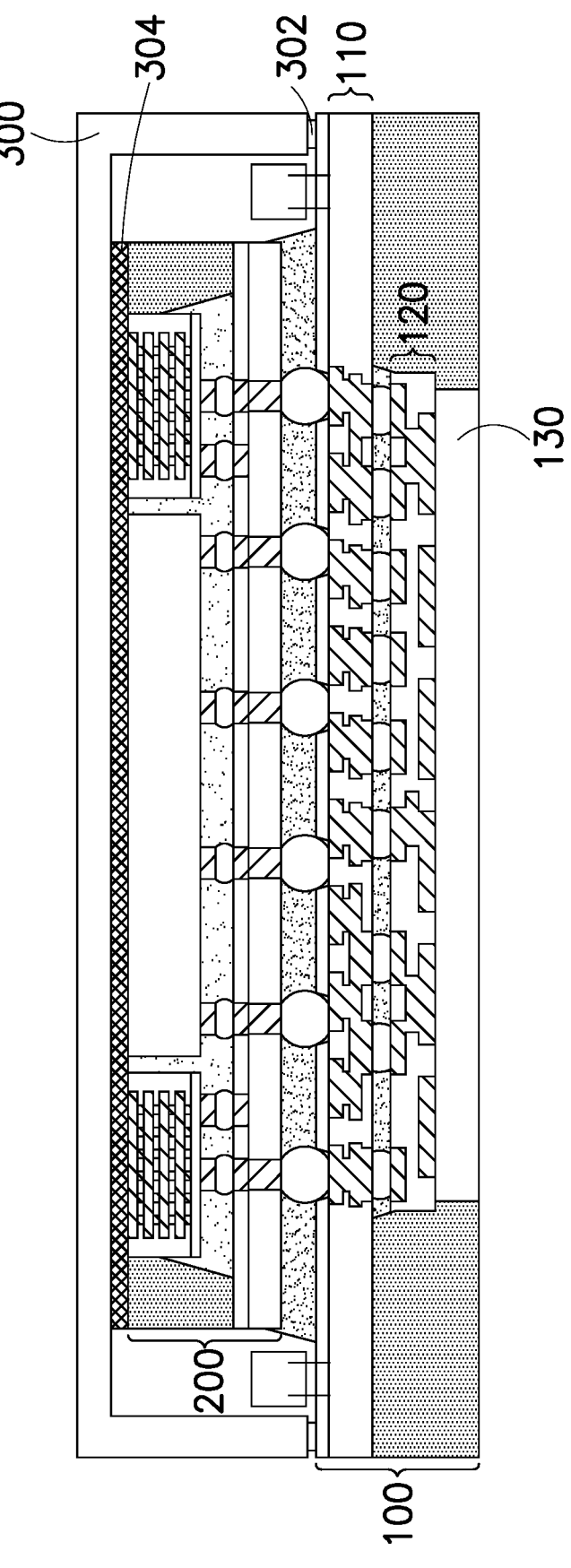
Figure 15:
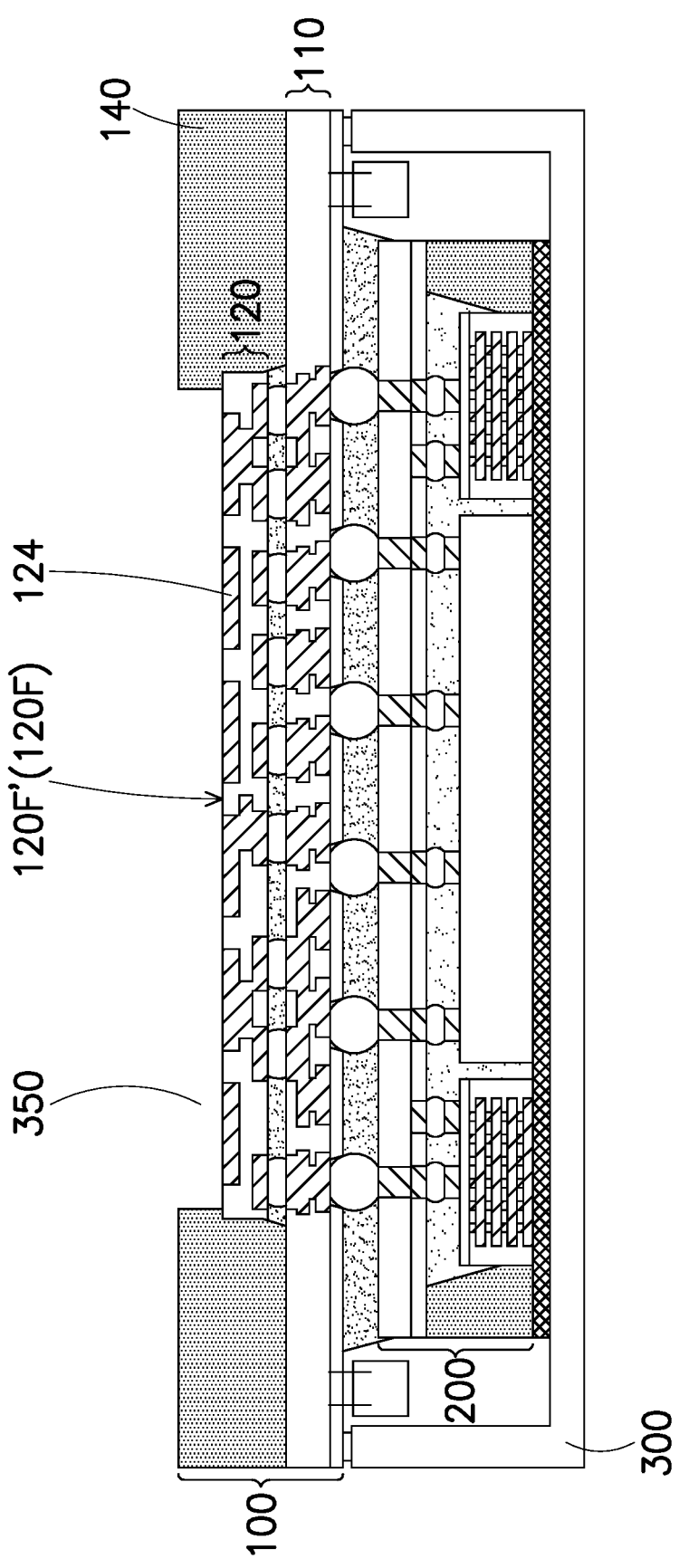

FIG. 14 illustrates the attachment of a heat dissipation lid 300 to the package component 100 and the integrated circuit package 200, in accordance with some embodiments. According to some embodiments, the heat dissipation lid 300 (which may also be metal lid) is attached to the package component 100 through adhesives 302 and attached to the integrated circuit package 200 through thermal interface material (TIM) 304. The TIM 304 may include a polymer having a good thermal conductivity (Tk). In some embodiments, the TIM 304 further includes thermal conducive fillers dispersed in the polymer. In alternative embodiments, the TIM 304 includes other materials such as a metallic-based or solder-based material comprising silver, indium paste, or the like. The TIM 304 may be in liquid form or may be a dry film. In some other embodiments, the thermal conductivity value of the adhesives 302 may be lower than the thermal conductivity of TIM 304.

In accordance with some embodiments, the lid attachment generally involves placing the heat dissipation lid 300 over the package component 100 and the integrated circuit package 200 and in physical contact with the adhesives 302 and the TIM 304. Further during the attachment of the heat dissipation lid 300, the heat dissipation lid 300 is pushed down against the adhesives 302 and the TIM 304 to ensure the physical contact to these features.

Subsequent to the lid attachment, the structure illustrated in FIG. 14 is flipped upside down and followed by removing the buffer film 130. The buffer film 130 is selectively removed using above-mentioned aqueous alkaline solution such as KOH-based or NaOH-based solution. Once the buffer film 130 is entirely removed, a cavity 350 surrounding by the insulating encapsulant 140 is formed above the substrate 120, exposing a portion of the substrate 120 at the front-side surface 120F. According to some embodiments, the exposed front-side surface of the substrate 120 corresponds to the major surface 120F' of the substrate 120 described above in FIG. 6. The metallization patterns 124 of the substrate 120 may be exposed at the major surface 120F' for further processing. Further in some embodiments, the exposed front-side surface (i.e., the major surface 120F') includes a substantially flat surface.

Figure 16:
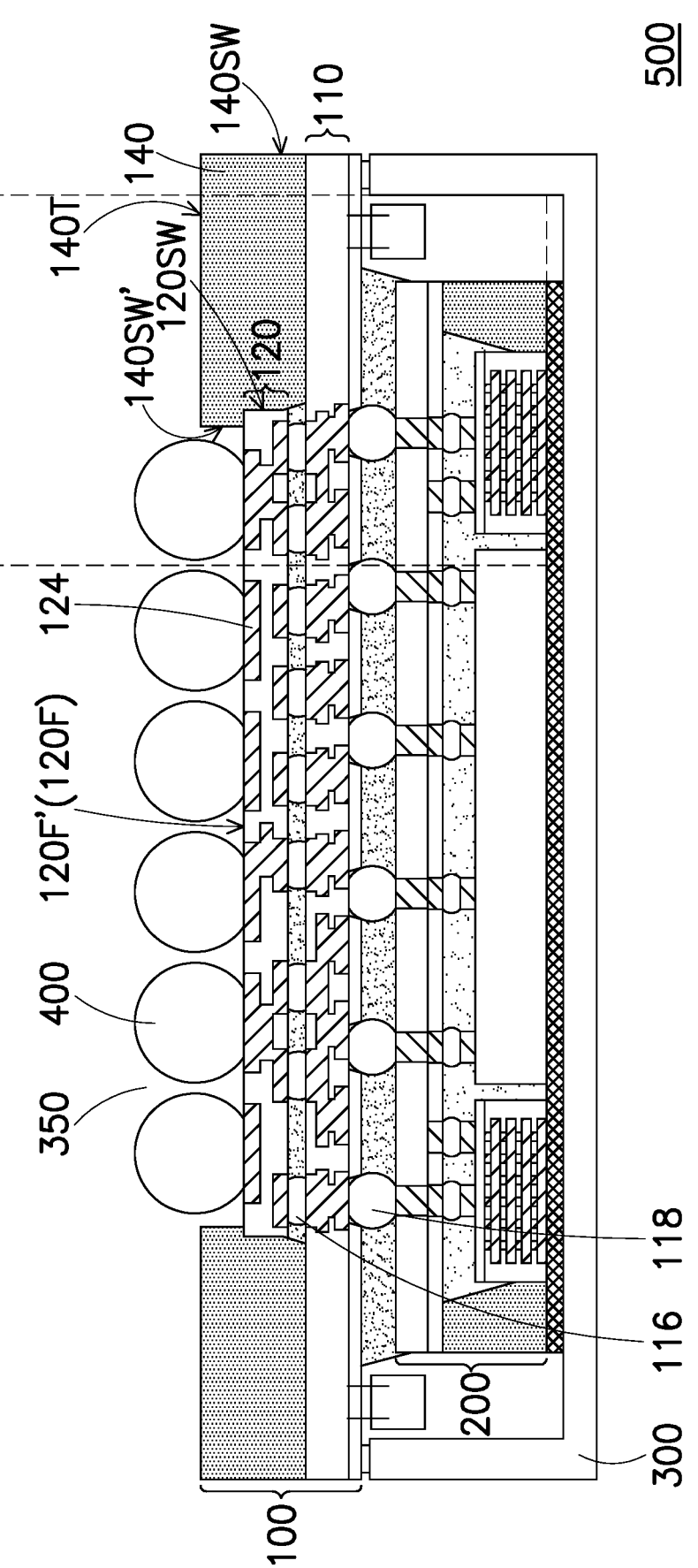

FIG. 16 illustrates the formation of a semiconductor device 500, in accordance with some embodiments. In some embodiments, a plurality of third conductive connectors 400 are formed in the cavity 350 and a semiconductor device 500 is then obtained. For example, the third conductive connectors 400 are formed directly on the exposed major surface

120F' of the substrate 120. In other words, the third conductive connectors 400 are in physical contact with the metallization patterns 124 of the substrate 120 and an electrical connection between the third conductive connectors and the substrate 120 is thus established. The third conductive connectors 400 are typically used for external electrical connection thus may be referred as external connectors 400. The third conductive connectors 400 may be similar to the first conductive connectors 116 in FIG. 3, or similar to the second conductive connectors 118 in FIG. 11. In alternative embodiments, dimensions of the third conductive connectors 400 are greater than those of the first conductive connectors 116 and/or the second conductive connectors 118. In some embodiments, the third conductive connectors 400 are arranged in an array within the cavity 350 (see FIG. 17). The structure of the semiconductor device 500 is described in greater detail below with reference made to FIGS. 17 and 18.

Figure 17:
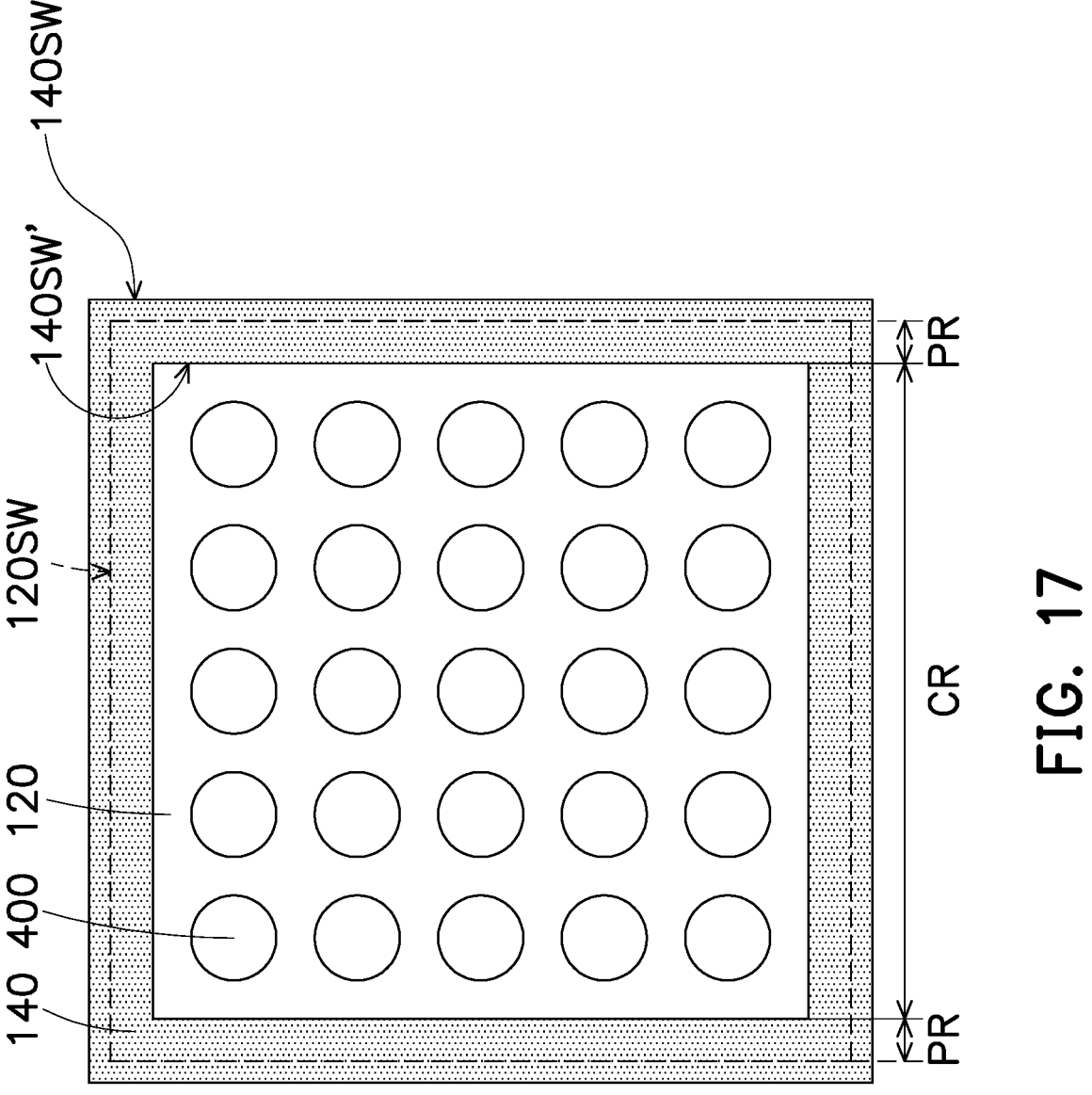
FIG. 17 is a top-down view of the exemplary structure of FIG. 16, in accordance with some embodiments of the disclosure.
Figure 18:
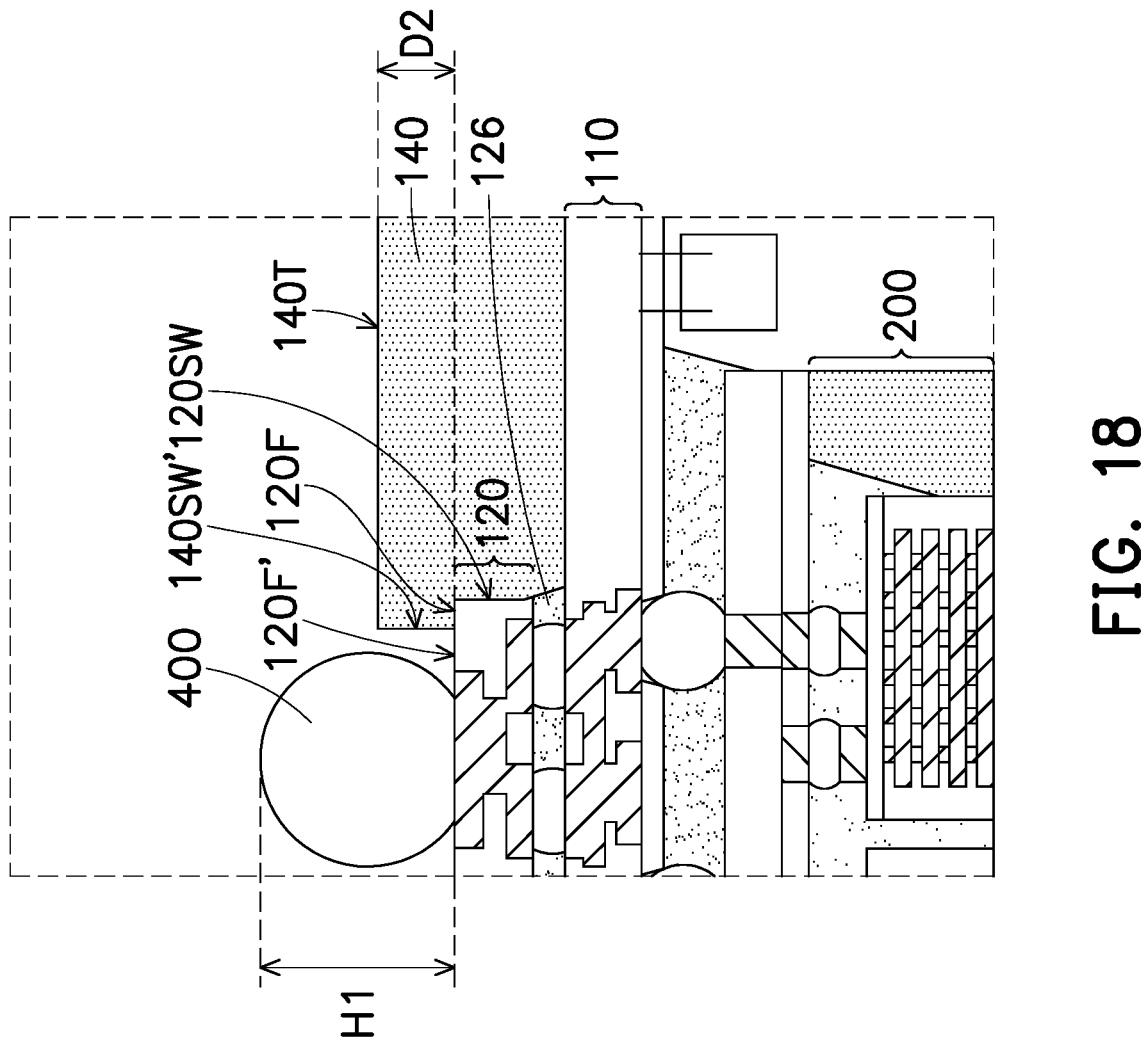
FIG. 18 is a cross-sectional view of an enlarged portion of the exemplary structure of FIG. 16, in accordance with some embodiments of the disclosure.

Referring now to FIGS. 17 and 18, a top-down view and a cross-sectional view of an enlarged portion of the structure illustrated in FIG. 16 are shown, in accordance with some embodiments. The simplified top-down view of FIG. 17 illustrates an exemplary arrangement of the third conductive connectors 400. In the illustrated embodiment, edges (i.e., inner sidewalls 140SW') of the insulating encapsulant 140 extend inwards from the respective edges (i.e., sidewalls 120SW) of the substrate 120 by a distance such that a perimeter region PR of the front-side surface 120F of the substrate 120 is covered by the insulating encapsulant 140. For example the distance between each inner sidewall 140SW' and each respective sidewall 120SW may be substantially the same with the distance D1 (which is also illustrated in FIG. 18) described above in FIG. 6. That is, a central region CR of the front-side surface 120F of the substrate 120, which is also referred as the major surface 120F', is exposed and uncovered by the insulating encapsulant 140. Further, the third conductive connectors 400 are disposed directly on the said major surface 120F' of the substrate 120. For example, the third conductive connectors 400 are located in the central region CR of the front-side surface 120F of the substrate and peripheral ones of the third conductive connectors 400 are further spaced apart with respective inner sidewalls 140SW' of the insulating encapsulant 140 by a distance. In other words, the third conductive connectors 400 are disposed within a bottom region of the cavity defined by inner sidewalls 140SW' of the insulating encapsulant 140, in accordance with some embodiments of the present disclosure. As illustrated in FIG. 17, the third conductive connectors 400 are arranged in a grid array. However, this is merely example and is not intended to be limiting. In alternative embodiments, the third conductive connectors 400 may be disposed in any suitable arrangements, depending on the design purpose.

Turning to FIG. 18, the cross-sectional view of the semiconductor device 500 is shown. The inner sidewall 140SW' of the insulating encapsulant 140 is shown as having substantially linear or vertical profile, in accordance with some embodiments. This is, of course, merely example and is not intended to be limiting. In the illustrated embodiment, the inner sidewall 140SW' is located on the substrate 120. In other words, the insulating encapsulant 140 partially covers or partially overlaps with the substrate 120. Thus, a vertical projection of the insulating material 140 may further partially overlaps with a vertical projection of the underfill layer 126 below the substrate 120. As illustrated in FIG. 18, the top surface 140T of the insulating encapsulant 140 extends over the substrates 120. For example, a distance D2 is between the top surface 140T and the top surface 120T of the substrate 120. In some embodiments, the distance D2 is substantially the same with the thickness T1 of the previously removed buffer film 130. In an alternative embodiment, the distance D2 is slightly less than the thickness T1. Further in some embodiments, a height H1 of each of third conductive connectors 400 is greater than the distance D2. The disclosure is not limited thereto.

The embodiments of the present disclosure may achieve several advantages. By applying removable temporary films on redistribution structures, surfaces of the redistribution structures are covered by the removable temporary film, thus the covered surfaces are protected from being damaged or contaminated during processing. As such, a good flatness and cleanliness of the surfaces of the redistribution structures can be obtained after removing the temporary films. Furthermore, the clean and flat surfaces provide increased process margin for subsequent processing thereon, such as fine pitch processes.

In accordance with an embodiment of the disclosure, a semiconductor device is described. The semiconductor device includes a first redistribution structure, a packaged device and a second redistribution structure. The packaged device is on a first side of the first redistribution structure and the second redistribution structure is on a second side of the first redistribution structure. An encapsulant is on the second side of the first redistribution structure and laterally around the second redistribution structure, wherein the encapsulant covers a periphery of the second redistribution structure such that an uncovered surface of the second redistribution structure is defined.

In accordance with another embodiment of the disclosure, a method of manufacturing a semiconductor device is described. The method includes at least the following steps. Substrates are mounted to a redistribution structure. Buffers are formed on the substrates. The substrates and the buffers are encapsulated with an encapsulant. The buffers are removed such that surfaces of the substrates are exposed. A plurality of external connectors is formed on the surfaces of the substrates.

In accordance with yet another embodiment of the disclosure, a method of manufacturing a semiconductor device is described. The method includes at least the following steps. A first redistribution structure and a second redistribution structure are formed. The second redistribution structure is disposed on a first side of the first redistribution structure. A polymer layer is dispensed on the second redistribution structure. The second redistribution structure and the polymer layer are encapsulated with an encapsulant. An integrated circuit package is attached to a second side of the first redistribution structure. The polymer layer is then removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first redistribution structure;
a packaged device on a first side of the first redistribution structure;
a second redistribution structure on a second side of the first redistribution structure;
a plurality of second conductive connectors connecting the first redistribution structure and the second redistribution structure;
an encapsulant on the second side of the first redistribution structure, wherein the encapsulant extends along a sidewall of the second redistribution structure to contact a first portion of a top surface of the second redistribution structure, and a second portion of the top surface of the second redistribution structure is exposed by the encapsulant;
a first underfill laterally surrounding the plurality of second conductive connectors, wherein the first underfill physically interfaces with the encapsulant to form an interface; and
a heat dissipation lid attached to the first side of the first redistribution structure to surround the packaged device.

2. The semiconductor device of claim 1, further comprising a thermal interface material (TIM) between the heat dissipation lid and the packaged device.

3. The semiconductor device of claim 1, further comprising a plurality of first conductive connectors on the second portion of the top surface of the second redistribution structure.

4. The semiconductor device of claim 3, wherein a top surface of the encapsulant is between the top surface of the second redistribution structure and a top surface of the plurality of first conductive connectors.

5. The semiconductor device of claim 1, wherein the encapsulant has a top surface above the the top surface of the second redistribution structure.

6. The semiconductor device of claim 1, wherein inner sidewalls of the encapsulant are located on the second redistribution structure.

7. The semiconductor device of claim 1, wherein outer sidewalls of the encapsulant are vertically aligned with outer sidewalls of the first redistribution structure.

8. The semiconductor device of claim 1,
wherein a vertical projection of the portion of the encapsulant overlaps with a vertical projection of the first underfill.

9. The semiconductor device of claim 1, wherein the packaged device is electrically connected to the first redistribution structure through a plurality of third conductive connectors, and the plurality of third conductive connectors is laterally encapsulated by a second underfill.

10. A method of manufacturing a semiconductor device comprising:
disposing a second redistribution structure on a first side of a first redistribution structure by a plurality of second conductive connectors connecting the first redistribution structure and the second redistribution structure;
dispensing a polymer layer on the second redistribution structure;
encapsulating the second redistribution structure and the polymer layer with an encapsulant;
attaching a packaged device to a second side of the first redistribution structure;
removing the polymer layer, wherein after removing the polymer layer, the encapsulant extends along a sidewall of the second redistribution structure to contact a first portion of a top surface of the second redistribution structure, and a second portion of the top surface of the second redistribution structure is exposed by the encapsulant;

forming a first underfill to laterally surround the plurality of second conductive connectors, wherein the first underfill physically interfaces with the encapsulant to form an interface; and attaching a heat dissipation lid to the second side of the first redistribution structure to surround the packaged device.

11. The method of claim 10, further comprising performing a planarization process on the encapsulant and the polymer layer.

12. The method of claim 10, wherein a cavity is formed after removing the polymer layer, and the second portion of the top surface of the second redistribution structure is exposed by the cavity.

13. The method of claim 12, wherein a bottom region of the cavity is surrounded by sidewalls of the encapsulant, and the sidewalls of the encapsulant have substantially linear profile.

14. The method of claim 12, wherein a plurality of first conductive connectors is formed on the surface of the second redistribution structure in the cavity.

15. A semiconductor device comprising:

a first redistribution structure having a first side and a second side opposite to each other;

an encapsulant overlying the second side of the first redistribution structure and having a cavity exposing a portion of the second side of the first redistribution structure;

a second redistribution structure disposed in the cavity and covering the portion of the second side of the first redistribution structure;

a plurality of first conductive connectors disposed on the second redistribution structure in the cavity, wherein the plurality of first conductive connectors has a top surface higher than a top end of the cavity, wherein the cavity has a sidewall on the second redistribution structure and aside the plurality of first conductive connectors, and the sidewall of the cavity is laterally separated from an edge of the plurality of first conductive connectors.

16. The semiconductor device of claim 15, wherein the second redistribution structure has a lateral width less than a lateral width of the first redistribution structure.

17. The semiconductor device of claim 15, further comprising an integrated circuit package disposed on the first side of the first redistribution structure, wherein the integrated circuit package comprises:

an interposer;

a plurality of dies on the interposer; and a molding layer on the interposer to laterally encapsulate the plurality of dies.

18. The semiconductor device of claim 17, further comprising:

a heat dissipation lid attached to the first side of the first redistribution structure to surround the integrated circuit package; and a thermal interface material (TIM) between the heat dissipation lid and the integrated circuit package.

19. The semiconductor device of claim 15, wherein a top surface of the encapsulant is between a top surface of the second redistribution structure and the top surface of the plurality of first conductive connectors.

20. The semiconductor device of claim 15, further comprising:

a plurality of second conductive connectors connecting the first redistribution structure and the second redistribution structure; and a first underfill laterally surrounding the plurality of second conductive connectors.

* * * * *